Figure 1:
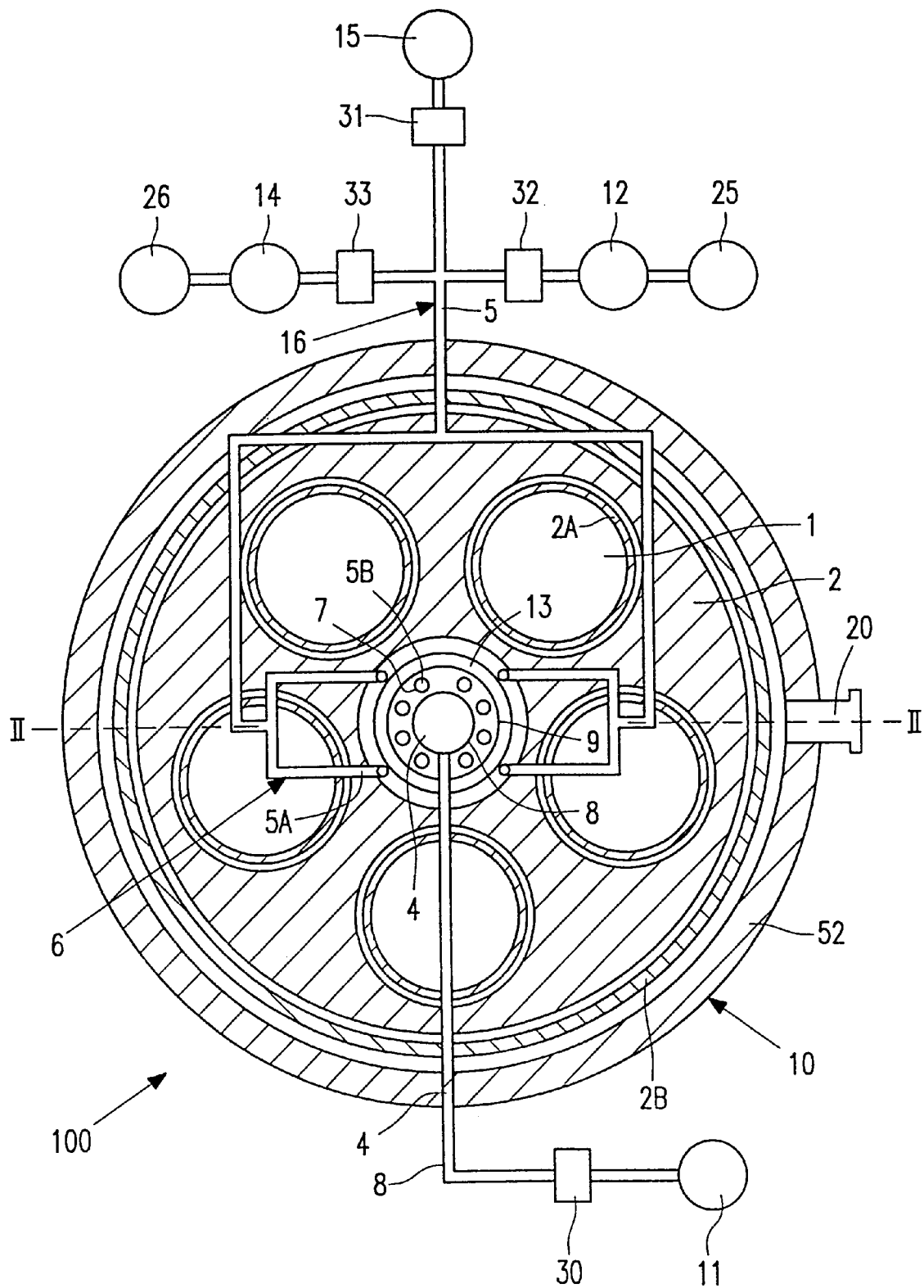

United States Patent

Van Geelen et al.

[11] Patent Number: 6,080,642
[45] Date of Patent: Jun. 27, 2000

[54] METHOD OF MANUFACTURING A SEMICONDUCTOR DEVICE AND A DEVICE FOR APPLYING SUCH A METHOD

[75] Inventors: André Van Geelen; Teunis Van Dongen, both of Eindhoven, Netherlands

[73] Assignee: JDS Uniphase Corporation, San Jose, Calif.

[21] Appl. No.: 09/044,545

[22] Filed: Mar. 19, 1998

[30] Foreign Application Priority Data

Apr. 10, 1997 [EP] European Pat. Off. ............. 97201064

[51] Int. Cl.$^7$ ................................................. C23C 16/00
[52] U.S. Cl. ......................... 438/478; 118/715; 118/730
[58] Field of Search ................................... 118/715, 730; 438/478

[56] References Cited

U.S. PATENT DOCUMENTS

| 3,854,443 | 12/1974 | Baerg | 118/730 |
| 4,860,687 | 8/1989 | Frijlink | 118/500 |
| 5,027,746 | 7/1991 | Frijlink | 118/724 |

FOREIGN PATENT DOCUMENTS

| 2397876 | 3/1979 | France | 118/715 |
| 61-263118 | 11/1986 | Japan | 118/715 |
| 62-81019 | 4/1987 | Japan | 118/715 |
| 598630 | 3/1978 | Russian Federation . | |

*Primary Examiner*—Richard Bueker
*Attorney, Agent, or Firm*—Michael A. Glenn

[57] ABSTRACT

A known method of manufacturing, for example, lasers comprises the deposition, on a substrate (1), of semiconductor layers from a gas (3) which includes at least two reactive components, such as TMG and arsine to form GaAs. The substrates (1) are arranged, within a reactor (10), on a supporting plate (2), heated and, preferably, rotated about their own center and the center of the supporting plate (2). Arsine (4) is supplied centrally above the supporting plate (2), and TMG (5) is supplied directly around said arsine, but separated therefrom, said TMG terminating at a larger distance from the supporting plate (2). These gases (4, 5) then flow sideways across the supporting plate (2) covered with substrates (1) and are discharged at the side thereof. Such a method results in a good homogeneity of the properties of the deposited semiconductor layer, which is crucial to many semiconductor devices. However, the spread, particularly, in the thickness but also in the composition, both within a substrate (1) and between two or more substrates (1) within a single deposition, as well as between different depositions, leaves to be desired.

In accordance with the invention, the TMG gas flow (5) is built up of n, n being greater than or equal to two, individual gas sub-flows (5A), each supplying 1/n th part of the second gas flow (5) and being supplied symmetrically with respect to the center of the supporting plate (2). Surprisingly, it has been found that this results in a substantial improvement of the above-mentioned homogeneities, in particular when the deposited semiconductor layer is very thin. Preferably, the TMG gas flow (5) is built up of an even number, preferably 4, gas sub-flows (5A). For this purpose, a device in accordance with the invention is equipped with a corresponding number of supply tubes (6). Use can further advantageously be made of a mixing chamber (13) for the gas sub-flows (5A) from which, for example at least twice as many, further gas sub-flows (5B) flow towards the supporting plate (2).

12 Claims, 2 Drawing Sheets

METHOD OF MANUFACTURING A SEMICONDUCTOR DEVICE AND A DEVICE FOR APPLYING SUCH A METHOD

The invention relates to a method of manufacturing a semiconductor device comprising the deposition of a semiconductor layer on a substrate, in which method, within a reactor, a number of substrates is placed on a supporting plate, heated and exposed to a gas which comprises at least two reactive components from which the semiconductor layer is formed, a first gas flow including a first reactive component being supplied centrally above the supporting plate, and, around the first gas flow and isolated therefrom, a second gas flow including a second reactive component being supplied, also from above, so as to be at a larger distance from the supporting plate than the first gas flow, whereafter both gas flows flow sideways across the supporting plate covered by the substrates, the semiconductor layer being formed on the substrate from the two reactive components, and, subsequently, said gas flows being discharged on the outside of the supporting plate. The invention also relates to a corresponding device for applying such a method.

Such a method and such a device can very suitably be used to manufacture semiconductor devices, in particular of III–V or II–VI semiconductor materials, which may comprise, for example, diode lasers, photodiodes or solar cells, but also transistors. The method and the device are extremely suitable if the semiconductor layers to be provided are very thin, as in the case of quantum-well layers, or if abrupt doping transitions are desirable.

Such a method and such a device are disclosed in United States patent specification U.S. Pat. No. 5,027,746, date of publication Jul. 2, 1991. In the method described in said specification, five III–V substrates are arranged on a supporting disc, heated by means of IR (=Infra Red) radiation and provided with a III–V semiconductor layer. A mixture of hydrogen and arsine and/or phosphine is supplied centrally above the supporting disc by means of a cylindrical tube. Around said mixture there is supplied an organo-metallic compound by means of a concentric tube surrounding the cylindrical tube, said compound being supplied so as to be situated at a greater distance from the supporting disc than the arsine and/or phosphone-containing gas flow. From the center of the supporting disc, the gas flows thus formed are moved sideways, one above the other, in the radial direction across the supporting plate and the substrates arranged thereon. The semiconductor layer to be formed is made from the reactive components of the gas flows, whereafter said gas flows are discharged at theperiphery of the supporting disc.

A disadvantage of the known method is that it yields semiconductor devices, such as diode lasers, having relatively poorly defined properties: for example, the emission wavelengths of diode lasers manufactured by means of said method have a relatively large spread, in particular, if the active layer of such diode lasers is formed by a (multi-) quantum well layer. As a result, the number of usable devices produced by means of said method often is relatively low, for example 50%.

It is an object of the invention to provide, inter alia, a method which enables a better definition of the properties of the devices manufactured by means of said method to be achieved and hence a greater yield of usable products, such as diode lasers. The invention also aims at providing a reactor which is suitable for this purpose. Both the method and the reactor should, of course, be as inexpensive as possible.

To achieve this, a method of the type mentioned in the opening paragraph is characterized in accordance with the invention in that the second gas flow is composed of n, n being greater than or equal to two, separate gas sub-flows which each supply 1/n th part of the second gas flow and which are supplied symmetrically with respect to the center of the supporting plate. The invention is primarily based on the insight that the poor definition of the properties of the devices manufactured by means of the method is caused by a spread, particularly, in the thickness but also in the composition of the semiconductor layers provided by means of the method. To suppress such a spread, preferably, both the supporting plate and the substrates are rotated about their axis during the deposition of the semiconductor layers. This is achieved, in particular, by blowing a gas into spirally grouped curved grooves or channels in the supporting plate and in rotatable portions thereof. The invention is also based on the insight that at customary rotation and growth rates of the supporting plate and the substrates, particularly in the case of very thin layers, such as quantum-well layers, the growth and rotation times, for example, of the supporting plate are of the same order of magnitude, namely approximately one second. As a result, any fluctuations in the growth rate are insufficiently coped with and averaged out by the rotation of the supporting plate. A further increase of the rotation rate or a reduction of the growth rate is unfeasible for various reasons or has other serious drawbacks. The invention is further based on the surprising discovery that, although the second gas flow is led to the supporting plate so as to be concentrical with the first gas flow, said second gas flow is not homogeneous in the tangential direction. Finally, the invention is based on the insight that said tangential inhomogeneity is caused by the fact that the second gas flow is formed from a single supply tube which is not situated centrally above the plate, and which cannot be situated in said location because the supply tube of the first gas flow is situated centrally above the plate, which is the proper location for said supply tube in connection with a tangentially homogeneous supply of the first reactive component. By building up the second gas flow by means of n gas sub-flows, n being at least equal to two, and each gas sub-flow supplying 1/n th part of the second gas flow to the supporting plate, and by supplying said gas sub-flows symmetrically with respect to the center of the supporting plate, a surprising, substantial improvement in homogeneity of the deposited semiconductor layers is achieved, particularly if said layers are very thin.

Substantially improved results relative to the known method are already achieved by employing two or three gas sub-flows which are diametrically supplied or by employing three gas sub-flows which are supplied at an angle of 120 degrees. Excellent results are achieved by utilizing four gas sub-flows which are supplied at an angle of 90 degrees. The use of an even larger number of gas sub-flows contributes to a further improvement of the homogeneity of the deposited layers. To achieve this, preferably, the gas sub-flows are combined again and, subsequently, divided into a larger number of further gas sub-flows. For the sake of the simplicity of the device in which the method is carried out, said division is preferably carried out within the reactor, as will be explained in greater detail in the sequel of this description where a device in accordance with the invention will be described.

The method in accordance with the invention is very suitable for the application of III–V semiconductor materials, such as InGaAsP and InAlGaP, for example, to III–V semiconductor substrates, such as InP and GaAs substrates. In this case, the first gas flow comprises, for example, arsine and/or phosphine, the second gas flow comprises an alkyl compound of In and/or Ga and/or Al, such as the trimethyl or triethyl compounds of said elements. Preferably hydrogen is used as the carrier gas for these volatile or volatilized substances.

In a preferred embodiment of a method in accordance with the invention, during the deposition of the semiconductor layer, the substrates are rotated about their center and about the center of the supporting plate by blowing a gas in the center of spirally grouped curved channels or grooves in the supporting plate and rotatable portions thereof which each support a substrate. Although both the first and the second gas flow are supplied as symmetrically as possible, rotation of the substrates and of the supporting plate still contributes substantially to the homogeneity of the properties of the semiconductor layers deposited by means of the method in accordance with the invention.

A device for the manufacture of a semiconductor device, which includes the deposition of a semiconductor layer on a substrate, which device comprises a reactor having a supporting plate for a number of substrates and means for heating said substrates, which reactor is provided, centrally above the supporting plate, with a first supply tube for a first gas flow with a first reactive component, which is connected to a first vessel containing the first reactive component, which first supply tube is surrounded by a second supply tube with a second reactive component which ends at a larger distance from the supporting plate than the first supply tube and which is connected to a second vessel containing the second reactive component, characterized in that the second supply tube comprises n ancillary supply tubes, with n being greater than or equal to two, each ancillary supply tube supplying 1/n th part of the second gas flow, and said ancillary supply tubes being arranged symmetrically with respect to the first supply tube. Such a device enables a method in accordance with the invention to be carried out in a simple manner. The second supply tube preferably comprises an even number, preferably four, ancillary supply tubes and said ancillary supply tubes preferably have a symmetric geometry. An even number of supply tubes is easier to connect symmetrically and enables (substantially) equal gas sub-flows to be obtained in a simple manner without the use of special aids such as (a large number of) MFCs (=Mass Flow Controllers). In this connection, it is essential to use supply tubes having a symmetric geometry (section, length and spatial variation).

Preferably, the ancillary supply tubes terminate in a mixing chamber in which the gas sub-flows can be mixed with each other, and which comprises a larger number, preferably at least twice as many, further ancillary supply tubes which are arranged as symmetrically as possible relative to the ancillary supply tubes and which, preferably, are permanently connected to the mixing chamber. In this manner, the homogeneity of the (further) gas sub-flows will be improved and, in addition, the degree of symmetry with which the gas sub-flows are supplied to the supporting plate is enhanced. A fixed connection between the mixing chamber(s) and further ancillary supply tubes makes it easier to permanently preclude undesirable asymmetry which may readily occur as a result of repeated (de-)mounting of separate parts. In a preferred embodiment of a device in accordance with the invention, the reactor comprises means for rotating the substrates about their center and about the center of the supporting plate, and said means comprise spirally grouped curved channels or grooves in the supporting plate and in rotatable portions thereof which are provided with a substrate, the center of the spirals being provided with a gas supply line.

These and other aspects of the invention will be apparent from and elucidated with reference to the embodiments described hereinafter.

Figure 2:
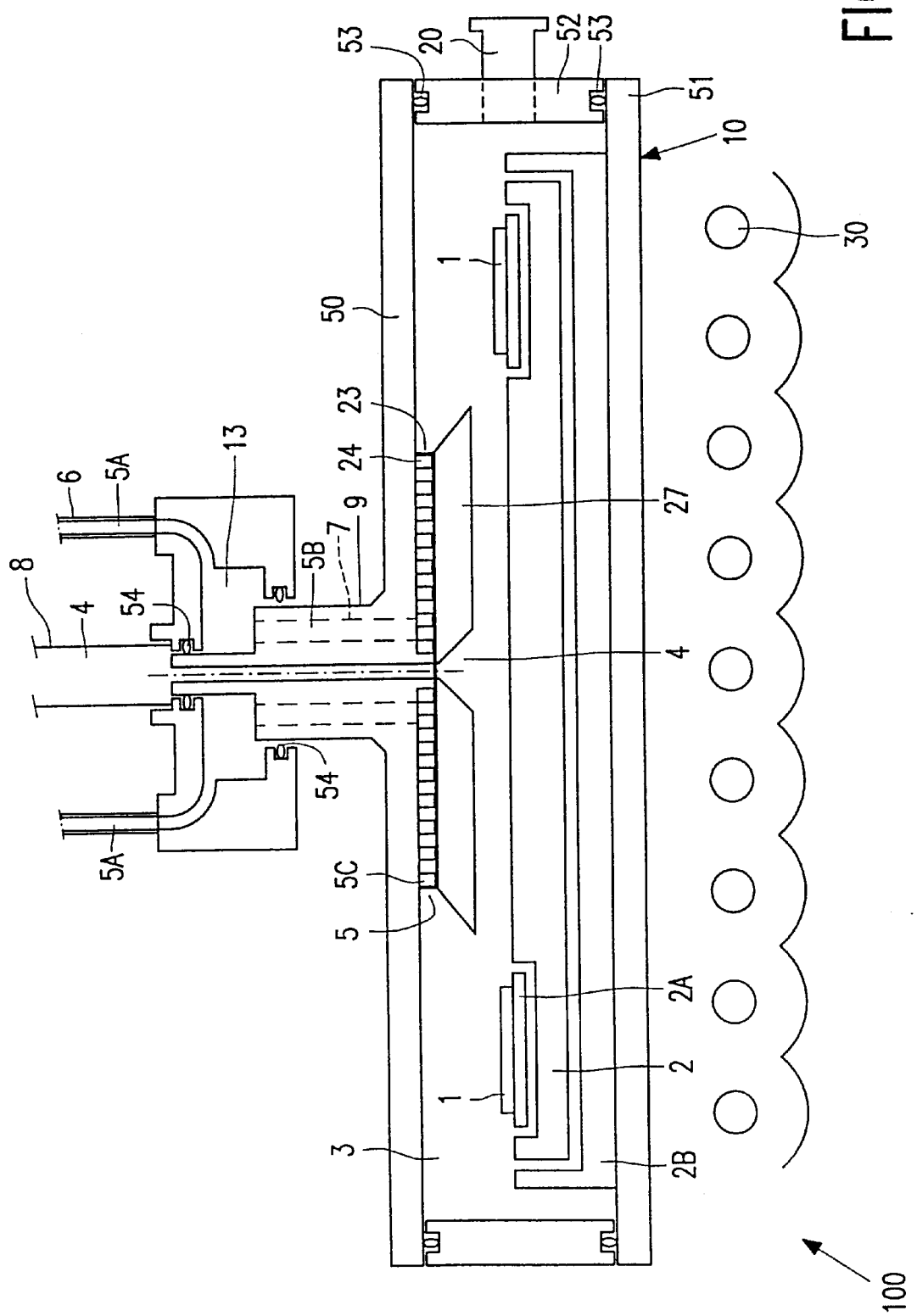

In the drawings:

FIGS. 1 and 2 are a plan view and a cross-sectional view, respectively, of a device in accordance with the invention for applying a method in accordance with the invention.

The Figures are diagrammatic and not drawn to scale, in particular, the thickness dimensions are exaggerated for clarity. In the Figures, corresponding parts generally bear the same reference numerals.

FIG. 1 is a plan view of a device in accordance with the invention in which a method according to the invention can be carried out. FIG. 2 is a cross-sectional view, taken on the line II—II, of the device shown in FIG. 1. The method and the device 100 of this example are MOVPE (=Metal Organic Vapor Phase Epitaxy) and a system 100, in which semiconductor layers, in this case of III–V semiconductor materials such as AlGaAs and GaAs, are deposited, for example, on a GaAs substrate 1. This is carried out as follows. Within a reactor 10, a number of GaAs substrates 1 are placed on a supporting plate 2. Said supporting plate 2 can be rotated about its axis, and the same applies to rotatable portions 2A of the supporting plate 2. In this manner, the substrates 1 can be rotated about the center of the supporting plate 2 and about their own center. Below the reactor 10, there are means 30, in this case in the form of halogen lamps 30, which are used to heat the substrates 1, i.e. the supporting plate 2, to, in this example, 700° C. A gas 3 comprising at least two, in this case three, reactive components from which the semiconductor layer is formed is provided above the substrates. Said gas 3 is formed by a first gas flow 4 with a first reactive component, in this case arsine diluted in hydrogen, which is supplied centrally above the supporting plate 2. A second gas flow 5 with a second reactive component, in this case two reactive components, namely TMG (=TriMethyl Gallium) and TMA (=TriMethyl Aluminium), also diluted in hydrogen, is also supplied from above and provided around the first gas flow 4 so as to be isolated therefrom. This second gas flow is at a greater distance from the supporting plate 2 than the first gas flow 4. Both gas flows 4, 5 subsequently flow sideways across the supporting plate 2 covered by the substrates 1. In this process, the semiconductor layer, in this case an AlGaAs layer, is deposited. Finally, both gas flows 4, 5 are discharged at the periphery of the supporting plate 2.

In a method in accordance with the invention, the second gas flow 5 n, n being greater than or equal to two, is built up of individual gas sub-flows 5A which each supply 1/n th part of the second gas flow 5 and which are supplied so as to be symmetrical relative to the center of the supporting plate 2. Surprisingly, it has been found that such a supply of the second gas flow contributes substantially to the homogeneity, in particular, of the thickness, for example, of GaAs or AlGaAs layers and also of the composition of the AlGaAs layers. Said contribution to the homogeneity is also achieved when the substrates 1 are rotated about their axis as well as about the center of the supporting plate 2, and, in particular, if a very thin semiconductor layer, such as, in this case, a GaAs/AlGaAs quantum-well layer, is deposited. If use is made of the preferred method of rotating, i.e. by blowing a gas into spirally curved grooves or channels (not shown in the drawing) which are situated in the supporting plate 2 and rotatable portions 2A thereof, the maximally attainable speed of rotation of the supporting plate 2 which, as shown in this example, supports 5 substrates 1 having a diameter of 2 inches, is approximately 1 revolution per second, which can be attributed to the risk that the rotatable portions 2A might get stuck as a result of the centrifugal force caused by the rotation of the supporting plate 2. This rate of rotation is of the same order of magnitude as the desired growth rate of a very thin, for example 2 nm thick, layer. A further reduction of the growth time, by reducing the concentration, in particular, of the second reactive component in the gas 3 and hence in the second gas flow 5, has serious disadvantages, such as the incorporation of more impurities in the thin layer and roughening of the transitions of the thin layers. The invention is further based on the surprising discovery that, although in the known method the second gas flow 5 is supplied to the supporting plate so as to be concentrical with the first gas flow 4, said second gas flow is not homogeneous in the tangential direction. Finally, the invention is based on the recognition that said tangential inhomogeneity is caused by the fact that, in the known method, the second gas flow 5 is supplied near the supporting plate so as to be concentrical with the first gas flow 4, but, at a slightly larger distance from the supporting plate 2, said second gas flow is necessarily eccentrical in consequence of a central supply of the first gas flow 4. By building up the second gas flow 5 by means of n gas sub-flows 5A, n being at least equal to two, and each gas sub-flow supplying 1/n th part of the second gas flow 5 to the supporting plate, and by supplying said gas sub-flows 5A symmetrically relative to the center of the supporting plate 2, a surprising and substantial improvement in homogeneity of the deposited semiconductor layers is achieved, in particular, if the layers are very thin.

In this example, the second gas flow 5 is built up of an even number, in this case 4, gas sub-flows 5A. By virtue thereof, on the one hand, a symmetric supply can be easily achieved and, on the other hand, the attainable improvement in the homogeneity of the properties of the deposited layer has already been achieved to a very substantial degree. In this example, further, an important improvement of said homogeneity is achieved by joining together, in this case in the mixing chamber 13, the gas sub-flows 5A of the second gas flow 5 before they reach the supporting plate 2, and, subsequently, subdividing them into a larger number, preferably twice as many, i.e. in this case 8, separate gas sub-flows 5B which, preferably, each supply a substantially equal portion of the second gas flow 5.

As regards the manner in which the supporting plate 2 and the substrates 1 situated thereon are rotated, here it is sufficient to refer to the above-mentioned U.S. patent specification 5,027,746. For more details in respect thereto reference is made to U.S. patent specification 4,860,687, date of publication Aug. 29, 1989. In this example, the first gas flow 4 amounts to 2.5 l/min and is composed of 250 cc/min arsine and hydrogen. If necessary, an n-doping may be added to this gas flow. The second gas flow 5 amounts to 25 l/min and is predominantly composed of hydrogen and a few cc/min of TMG and/or TMAl which are each evaporated in a hydrogen flow of 0.5 l/min. Any p-doping is preferably added to the second gas flow 5.

The more than excellent results which are achieved by a method in accordance with the invention can be illustrated by means of the deposition of AlGaAs layers comprising 50 at % of aluminium. As regards the uniformity in composition, a method in accordance with the invention enables a spread in the composition of all substrates 1 used in a deposition operation of 0.1 relative per cent to be achieved. In the known method, a corresponding spread of 1.2 relative per cent is achieved. The improved spread in thickness will be shown hereinafter by means of a GaAs/AlGaAs quantum-well layer whose thickness is chosen to range between 1 and 10 nm. Within a substrate 1, a method in accordance with the invention enables, for example, a spread in the position of the peak of the PL (=Photo Luminescence) at 4 K of 0.4 meV to be achieved, whereas the known method results in a spread of 2.3 meV. These values correspond to a spread in thickness. If such a measurement is carried out in the center of all substrates 1 used in a single deposition operation, a method in accordance with the invention enables a spread in the position of the 4 K PL peak of 0.5 to 1 meV to be achieved, whereas the known method yields a spread of 4 to 12 meV. In particular this improvement illustrates the effect of the invention. A method in accordance with the invention also leads to an improved interface steepness, which manifests itself in a FWHM (=Full Width Half Maximum) of a 4 K PL measurement of 4 to 8 meV, whereas the known method results in 12 to 15 meV. The above-mentioned results are achieved by rotating the supporting plate 2 and the rotatable parts 2A thereof. All in all, it can be concluded from the above that, by virtue of the present invention, the output of usable semiconductor devices, for example long-wave diode lasers, has improved considerably and amounts, for example, to 70% or even 80%.

In the exemplary device 100 in accordance with the invention, the reactor 10 is situated centrally above the supporting plate 2 of a first supply tube 8 which supplies the first gas flow 4 and terminates just above the supporting plate 2. On the other side, the first supply tube 8 is connected, via a first MFC 38, to a first vessel 11 comprising a (gaseous) hydrogen and 10% of arsine. Around the first supply tube 8, there is situated a concentric second supply tube 9 which transfers the second gas flow 5 to the supporting plate 2 and which terminates at a slightly greater distance from said supporting plate than the first supply tube 8. The second supply tube 9 is symmetrically provided with four ancillary supply tubes 6 which are connected to a second vessel, in this case a first bubble vessel 12 and a second bubble vessel 14, which comprise the second reactive component, here two reactive components, namely (liquid) TMG and (liquid) TMAl, respectively. The four ancillary supply tubes 6 form a dual, symmetric bifurcation of a main supply tube 16 which is connected, via a second MFC 31, to a first hydrogen cylinder 15. The bubble vessels 12, 14 are connected to this main supply tube 16 via MFCs 32, 33. On the other side, the bubble vessels are connected, respectively, to a second hydrogen cylinder 25 and a third hydrogen cylinder 26.

In this example, a further homogenization of the second gas flow 5 is achieved in that the four ancillary supply tubes 6 terminate, close to the reactor 10, in a mixing chamber 13 which is connected to the supply tube 9 which, in this example, is subdivided into 8 further ancillary supply tubes 7 which are positioned so that, viewed in projection, an ancillary supply tube 6 is situated between two further ancillary supply tubes 7. Finally, in this example, a further improvement of the homogeneity of the second gas flow 5 is achieved in that, within the reactor 10, the second supply tube 9 blends with a further supply tube 23 whose diameter is larger than that of the second supply tube 9 and whose periphery is provided with 64 apertures 24. Below said supply tube 23, there is situated a closed body 27 having conical profiles adjoining the first supply tube 8 and the further supply tube 23. These conical profiles contribute to a uniform outflow of the first gas flow 4 and the second gas flow 5 above the supporting plate 2. Said body 27, the further supply tube 23 and the second supply tube 9, and a small part of the first supply tube 8 as well as the upper plate 50 are made of quartz and form a rigid, in this case, single part. By virtue thereof, it is precluded that an asymmetry is introduced if one or more of the last-mentioned parts are mounted. After all, if a plurality of individual parts (continually) have to be secured to each other, there is always a risk of asymmetry as a result of the necessary clearance between the various parts. This too, in accordance with the invention, contributes to an improved tangential homogeneity of the second gas flow 5.

The reactor 10 further comprises a lower plate 51 of quartz and a jacket 52 of stainless steel which comprises one or more outlets 20 and which is connected, by means of O-rings 53, to the upper plate 50 and the lower plate 51, which is also made of quartz. The supporting plate 2 is made of graphite. The diameter of the reactor 10 is approximately 25 cm. The distance between the supporting plate 2 and the lower side of the upper plate 50 is 10 to 20 mm. The diameter of the first supply tube 8 is 6 mm, the diameter of the second supply tube 9 is 20 mm, the diameter of the ancillary supply tubes 6 is 6 mm, and the diameter of the further ancillary supply tubes 7 is 3 mm. The stainless steel mixing chamber 13 is cylindrical in shape, has a diameter of 20 mm, and is connected to the first supply tube 8 and the second supply tube 9 by means of further O-rings 54. The windows 24, in this case 64, have dimensions of 2 mm by 2 mm.

The invention is not limited to the embodiment described herein, and, within the scope of the invention, many variations are possible to those skilled in the art. For example, other III–V semiconductor materials or other compositions can be used. Alternatively, phosphine can be used in addition to or instead of arsine. It is alternatively possible to deposit II–VI or other materials. Apart from lasers and LEDs, a method in accordance with the invention can also be used to manufacture (photo)diodes and transistors and even entire integrated circuits. One or more of the above-mentioned rotations can alternatively be brought about by means of electric motors.

As regards the device in accordance with the invention, it is noted that in this example the (further) gas sub-flows are formed by a (substantially) symmetric (further) bifurcation of the second main supply line of the second gas flow. It is alternatively possible, however, to use unbranched or at least non-symmetrically branched supply lines. In that case, use can be made of additional MFCs to obtain equally large (further) gas sub-flows. Further, it is noted that the device is preferably of the so-called VENT/RUN-type, so that discontinuities upon switching of gas flows are dealt with or precluded. Finally, it is noted that the MFCs dosing the second reactive component are preferably arranged in front of the bubble vessels, while a pressure regulator is arranged behind the bubble vessels.

What is claimed is:

1. A method of manufacturing a semiconductor device comprising the deposition of a semiconductor layer on a substrate (1), in which method, within a reactor (10), a number of substrates (1) is placed on a supporting plate (2), heated and exposed to a gas (3) which comprises at least two reactive components from which the semiconductor layer is formed, a first gas flow (4) including a first reactive component being supplied centrally above the supporting plate (2), and, around the first gas flow (4) and isolated therefrom, a second gas flow (5) including a second reactive component being supplied, also from above, so as to be at a larger distance from the supporting plate (2) than the first gas flow (4), whereafter both gas flows (4, 5) flow sideways across the supporting plate (2) covered by the substrates (1), the semiconductor layer being formed on the substrate (1) from the two reactive components, and, subsequently, said gas flows being discharged on the outside of the supporting plate (2), characterized in that the first gas flow is composed of a single gas flow and the second gas flow is composed of (5) n, n being greater than or equal to two, separate gas sub-flows (5A) which each supply 1/n th part of the second gas flow (5) and which are supplied symmetrically with respect to the center of the supporting plate (2), and further characterized in that the gas sub-flows (5A) of the second gas flow (5) are combined before they reach the supporting plate, after which they are subdivided again into a larger number, comprising at least twice as many (2n), of further independent gas sub-flows (5B) which each supply a substantially equal part (1/2/n) of the second gas flow (5).

2. A method as claimed in claim 1, characterized in that the second gas flow (5) is built up of an even number of at least 4, gas sub-flows (5A).

3. A method as claimed in claim 2, characterized in that the first gas flow (4) is formed by adding a gaseous compound of a group V-element hydride, to a carrier gas comprising hydrogen, and in that the second gas flow (5) is formed by adding a gaseous compound of a group III-element alkyl compound, to a carrier gas comprising hydrogen.

4. A method as claimed in claim 3, characterized in that the semiconductor layer is formed so as to correspond to a multi-quantum well semiconductor layer structure.

5. A method as claimed in claim 4, characterized in that during the deposition of the semiconductor layer, the substrates (1) are rotated about their center and about the center of the supporting plate (2) by blowing a gas in the center of spirally grouped curved channels or grooves in the supporting plate (2) and rotatable portions (2A) thereof which each support a substrate (1).

6. A method as claimed in claim 1, characterized in that the first gas flow (4) is formed by adding a gaseous compound of a V-group element hydride, to a carrier gas comprising hydrogen, and in that the second gas flow (5) is formed by adding a gaseous compound of a group III-element alkyl compound, to a carrier gas comprising hydrogen.

7. A method as claimed in claim 1, characterized in that the semiconductor layer is formed so as to correspond to a multi-quantum well semiconductor layer structure.

8. A method as claimed in claim 1, characterized in that during the deposition of the semiconductor layer, the substrates (1) are rotated about their center and about the center of the supporting plate (2) by blowing a gas in the center of spirally grouped curved channels or grooves in the supporting plate (2) and rotatable portions (2A) thereof which each support a substrate (1).

9. A device (100) for the manufacture of a semiconductor device, which includes the deposition of a semiconductor layer on a substrate (1), which device comprises a reactor (10) having a supporting plate (2) for a number of substrates (1) and means (30) for heating said substrates (1), which reactor (10) is provided, centrally above the supporting plate (2), with a first supply tube (8) for a first gas flow (4) with a first reactive component, which is connected to a first vessel (11) containing the first reactive component, which first supply tube is surrounded by a second supply tube (9) with a second reactive component which ends at a larger distance from the supporting plate (2) than the first supply tube (8) and which is connected to a second vessel (12, 14) containing the second reactive component, characterized in that the first supply tube comprises a single supply tube and the second supply tube (9) comprises n ancillary supply tubes (6), with n being greater than or equal to two, each ancillary supply tube supplying 1/n th part (5A) of the second gas flow (5), and said ancillary supply tubes being arranged symmetrically with respect to the first supply tube (8), and further characterized in that the ancillary supply tubes (6) terminate in a mixing chamber (13) in which the gas sub-flows (5A) can be mixed with each other, and which comprises a larger number, at least twice as many, further ancillary supply tubes (7) which are arranged as symmetrically as possible relative to the ancillary supply tubes (6) and which are permanently connected to the mixing chamber (13).

10. A device (100) as claimed in claim 9, characterized in that the second supply tube (9) comprises an even number of at least four, ancillary supply tubes (6) and said ancillary supply tubes (6) have a symmetric geometry.

11. A device (100) as claimed in claim 10, characterized in that the reactor (10) comprises means for rotating the substrates (1) about their center and about the center of the supporting plate (2), and said means comprise spirally grouped curved channels or grooves in the supporting plate (2) and in rotatable portions (2A) thereof which are provided with a substrate (1), the center of the spirals being provided with a gas supply line.

12. A device (100) as claimed in claim 9, characterized in that the reactor (10) comprises means for rotating the substrates (1) about their center and about the center of the supporting plate (2), and said means comprise spirally grouped curved channels or grooves in the supporting plate (2) and in rotatable portions (2A) thereof which are provided with a substrate (1), the center of the spirals being provided with a gas supply line.

* * * * *